United States Patent
Huang et al.

(10) Patent No.: US 9,209,124 B2
(45) Date of Patent: Dec. 8, 2015

(54) CHIP PACKAGE

(71) Applicant: XINTEC INC., Jhongli, Taoyuan County (TW)

(72) Inventors: Yu-Lung Huang, Daxi Township (TW); Chao-Yen Lin, New Taipei (TW); Wei-Luen Suen, New Taipei (TW); Chien-Hui Chen, Zhongli (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 13/964,999

(22) Filed: Aug. 12, 2013

(65) Prior Publication Data
US 2014/0054786 A1    Feb. 27, 2014

Related U.S. Application Data

(63) Continuation-in-part of application No. 13/105,775, filed on May 11, 2011, now Pat. No. 8,507,321.

(60) Provisional application No. 61/333,459, filed on May 11, 2010.

(51) Int. Cl.
    *H01L 23/498*      (2006.01)
    *H01L 21/768*      (2006.01)
    (Continued)

(52) U.S. Cl.
CPC ........ *H01L 23/49838* (2013.01); *H01L 21/561* (2013.01); *H01L 21/768* (2013.01); *H01L 23/3121* (2013.01); *H01L 23/525* (2013.01); *H01L 23/585* (2013.01); *H01L 24/05* (2013.01); *H01L 24/16* (2013.01); *H01L 29/0657* (2013.01); *H01L 21/6836* (2013.01); *H01L 24/48* (2013.01); *H01L 2221/6834* (2013.01); *H01L 2221/68327* (2013.01); *H01L 2224/02371* (2013.01); *H01L 2224/02375* (2013.01); *H01L 2224/02379* (2013.01); *H01L 2224/02381* (2013.01); *H01L 2224/0401* (2013.01); *H01L 2224/04042* (2013.01); *H01L 2224/05548* (2013.01); *H01L 2224/05558* (2013.01); *H01L 2224/06165* (2013.01); (Continued)

(58) Field of Classification Search
CPC ............... H01L 2924/414; H01L 2924/01079; H01L 2924/01013; H01L 2924/01029; H01L 2924/01078
USPC ......................................................... 257/773
See application file for complete search history.

(56) References Cited

U.S. PATENT DOCUMENTS 5,478,781 A    12/1995   Bertin et al.
7,199,345 B1    4/2007   Meisel et al.
(Continued)

FOREIGN PATENT DOCUMENTS

CN      101276820      10/2008
CN      103107153      5/2013
(Continued)

*Primary Examiner* — Monica D Harrison
(74) *Attorney, Agent, or Firm* — LIU & LIU

(57) ABSTRACT

An embodiment of the invention provides a chip package including a semiconductor substrate having a first surface and a second surface opposite thereto. A conducting pad is located on the first surface. A side recess is on at least a first side of the semiconductor substrate, wherein the side recess extends from the first surface toward the second surface and across the entire length of the first side. A conducting layer is located on the first surface and electrically connected to the conducting pad, wherein the conducting layer extends to the side recess.

26 Claims, 15 Drawing Sheets

(51) Int. Cl.
  *H01L 23/31* (2006.01)
  *H01L 21/56* (2006.01)
  *H01L 23/00* (2006.01)
  *H01L 23/58* (2006.01)
  *H01L 23/525* (2006.01)
  *H01L 29/06* (2006.01)
  *H01L 21/683* (2006.01)

(52) U.S. Cl.
  CPC ........... *H01L 2224/06167* (2013.01); *H01L 2224/131* (2013.01); *H01L 2224/16105* (2013.01); *H01L 2224/16227* (2013.01); *H01L 2224/48091* (2013.01); *H01L 2224/48227* (2013.01); *H01L 2224/73215* (2013.01); *H01L 2224/73253* (2013.01); *H01L 2224/94* (2013.01); *H01L 2924/10155* (2013.01); *H01L 2924/10253* (2013.01); *H01L 2924/12041* (2013.01); *H01L 2924/1306* (2013.01); *H01L 2924/13091* (2013.01); *H01L 2924/14* (2013.01); *H01L 2924/1461* (2013.01); *H01L 2924/15788* (2013.01)

(56) References Cited

U.S. PATENT DOCUMENTS

| | | | |
|---|---|---|---|
| 8,736,080 | B2 | 5/2014 | Arnold et al. |
| 8,952,501 | B2 | 2/2015 | Huang et al. |
| 2006/0270089 | A1 | 11/2006 | Huang et al. |
| 2008/0001241 | A1 | 1/2008 | Tuckerman et al. |
| 2008/0096321 | A1 | 4/2008 | Lin et al. |
| 2008/0315407 | A1* | 12/2008 | Andrews et al. ............ 257/735 |
| 2011/0241216 | A1 | 10/2011 | Tada et al. |
| 2011/0278724 | A1 | 11/2011 | Lin et al. |
| 2013/0285240 | A1 | 10/2013 | Last et al. |
| 2013/0343022 | A1 | 12/2013 | Hu et al. |

FOREIGN PATENT DOCUMENTS

| | | |
|---|---|---|
| JP | 2002-151546 | 5/2002 |
| JP | 2004-363400 | 12/2004 |
| TW | 201140779 | 11/2011 |

* cited by examiner

CHIP PACKAGE

CROSS REFERENCE TO RELATED APPLICATIONS

This application is a Continuation-In-Part of U.S. patent application Ser. No. 13/105,775, filed May 11, 2011, now U.S. Pat. No. 8,507,321, and entitled "Chip package and method for forming the same", which claims the benefit of U.S. Provisional Application No. 61/333,459, filed on May 11, 2010, the entirety of which are incorporated by reference herein.

BACKGROUND OF THE INVENTION

1. Field of the Invention

The invention relates to a chip package and methods for forming the same, and in particular to a chip package formed by a wafer-level packaging process.

2. Description of the Related Art

Conventional manufacturing processes of chip packages concern multiple patterning processes and material-deposition processes, which not only cost a lot, but also require a long processing time.

Therefore, a simplified and fast chip-packaging technique is desired.

BRIEF SUMMARY OF THE INVENTION

An embodiment of the invention provides a chip package comprising a semiconductor substrate having a first surface and a second surface opposite thereto. A conducting pad is located on the first surface. A side recess is on at least a first side of the semiconductor substrate, wherein the side recess extends from the first surface toward the second surface and across the entire length of the first side. A conducting layer is located on the first surface and electrically connected to the conducting pad, wherein the conducting layer extends to the side recess.

An embodiment of the invention provides a method for forming a chip package comprising providing a semiconductor substrate having a first surface and a second surface opposite thereto, wherein the first surface has a conducting pad thereon. A portion of the semiconductor substrate is removed to form a first side recess on at least a first side of the semiconductor substrate, wherein the first side recess extends from the first surface toward the second surface and across the entire length of the first side. A conducting layer is formed on the first surface, wherein the conducting layer is electrically connected to the conducting pad and extends to the first side recess.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 13, 14A, 15A, 16A-1, 16A-2 and 17-22 are cross-sectional views of an exemplary embodiment of a method for forming a chip package according to the invention.

DETAILED DESCRIPTION OF THE INVENTION

The making and using of the embodiments of the present disclosure are discussed in detail below. However, it should be noted that the embodiments provide many applicable inventive concepts that can be embodied in a variety of specific methods. The specific embodiments discussed are merely illustrative of specific methods to make and use the embodiments, and do not limit the scope of the disclosure. The disclosed contents of the present disclosure include all the embodiments derived from claims of the present disclosure by those skilled in the art. In addition, the present disclosure may repeat reference numbers and/or letters in the various embodiments. This repetition is for the purpose of simplicity and clarity, and does not imply any relationship between the different embodiments and/or configurations discussed. Furthermore, when a first layer is referred to as being on or overlying a second layer, the first layer may be in direct contact with the second layer, or spaced apart from the second layer by one or more material layers.

A chip package according to an embodiment of the present invention may be used to package micro-electro-mechanical system's chips. However, embodiments of the invention are not limited thereto. For example, the chip package of the embodiments of the invention may be implemented to package active or passive devices or electronic components of integrated circuits, such as digital or analog circuits. For example, the chip package is related to optoelectronic devices, micro-electro-mechanical systems (MEMS), microfluidic systems, and physical sensors measuring changes to physical quantities such as heat, light, pressure, and so on. Particularly, a wafer-level package (WSP) process may be optionally used to package semiconductor chips, such as image-sensor elements, light-emitting diodes (LEDs), solar cells, RF circuits, accelerators, gyroscopes, microactuators, surface acoustic wave devices, pressure sensors, ink printer heads, power metal oxide semiconductor field effect transistor modules (power MOSFET modules), and so on.

The above-mentioned wafer-level package process mainly means that after the package step is accomplished during the wafer stage, the wafer with chips is cut to obtain individual packages. However, in a specific embodiment, separated semiconductor chips may be redistributed on a carrier wafer and then packaged, which may also be referred to as a wafer-level package process. In addition, the above-mentioned wafer-level package process may also be adapted to form a chip package having multi-layer integrated circuit devices by stacking a plurality of wafers having integrated circuits.

Figure 1A:
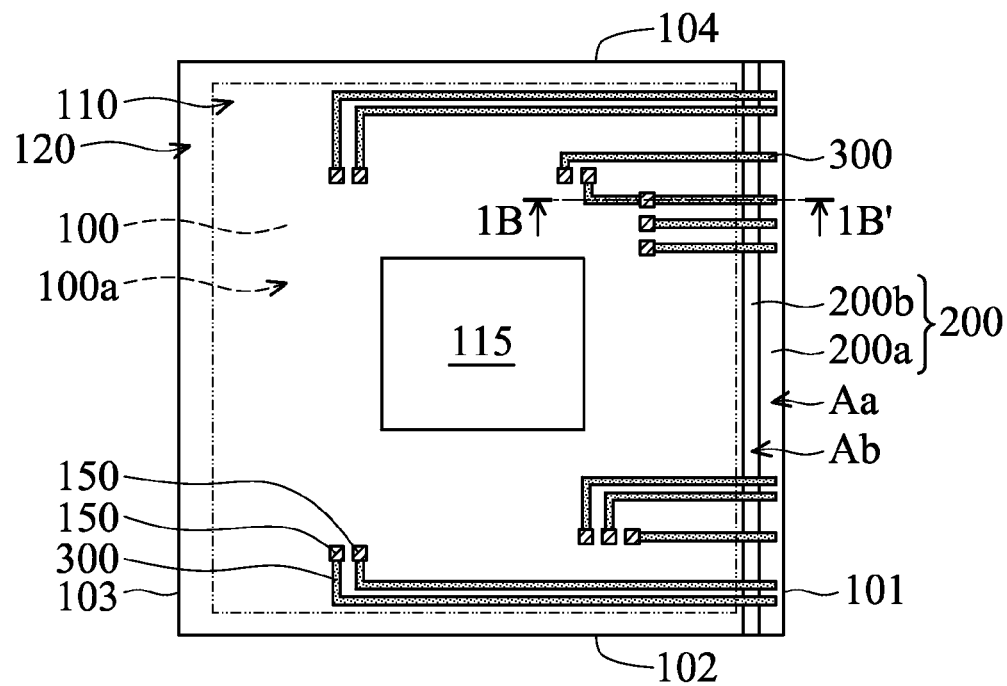
FIG. 1A is a plan view of an exemplary embodiment of a chip package according to the invention.
Figure 1B:
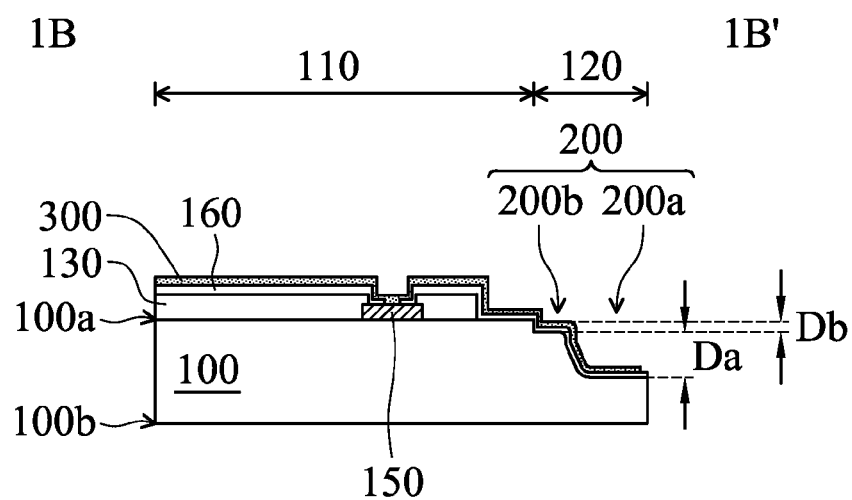
FIG. 1B is a cross-sectional view along the line 1B-1B' in FIG. 1A.

An exemplary embodiment of a chip package according to the invention is illustrated with FIGS. 1A and 1B, in which FIG. 1A is a plan view of an exemplary embodiment of a chip package according to the invention, and FIG. 1B is a cross-sectional view along the line 1B-1B' in FIG. 1A.

In the embodiment, the chip package comprises a semiconductor substrate 100, conducting pads 150, a dielectric layer 130, an insulating layer 160, conducting lines 300 and a side recess 200. The semiconductor substrate 100 has a first surface 100a and a second surface 100b opposite thereto, and comprises a chip region 110 and a predetermined scribe region 120 surrounding the chip region 110, in which the chip region 110 comprises a device region 115 therein, as shown in FIG. 1A. The device region 115 may include (but is not limited to) a sensor device, such as an image-sensor device. In one embodiment, the semiconductor substrate 100 is a silicon wafer so as to facilitate the wafer-level packaging process.

The conducting pads 150 are disposed on the first surface 100a of the semiconductor substrate 100 corresponding to the chip region 110. The conducting pads 150 may comprise a single conducting layer or multiple conducting layers, and may be electrically connected to the device region 115 by inner circuits (not shown).

The dielectric layer 130 is on the first surface 100a of the semiconductor substrate 100 corresponding to the chip region 110, and may comprise a stack of multiple dielectric layers and/or an overlying passivation layer. The dielectric layer 130 has openings exposing the conducting pads 150, as shown in FIG. 1B.

The side recess 200 is in the predetermined scribe region 120. In one embodiment, the side recess 200 is composed of a deep side recess 200a and a shallow side recess 200b, which form a step-form side recess. The side recess 200 is on a first side 101 of the semiconductor substrate 100 and extends across entire length of the first side 101, as shown in FIG. 1A. The side recess 200 extends from the first surface 100a toward the second surface 100b, as shown in FIG. 1B. Although FIG. 1A illustrates that both the deep side recess 200a and the shallow side recess 200b extend across the entire length of the first side 101, in some embodiments, only the deep side recess 200a extends across the entire length of the first side 101. In addition, it is realized that the number of side recesses shown in FIGS. 1A and 1B are illustrated as an example and not limited thereto. The actual number of side recesses is determined by design demands. For example, in one embodiment, the chip package comprises a cliff-form side recess merely formed of the deep side recess 200a without the shallow side recess 200b. In another embodiment, the chip package comprises a multi-step side recess formed of three or more continuous side recesses.

The insulating layer 160 is on the dielectric layer 130 and extends into the openings of the dielectric layer 130 to cover portions of the conducting pads 150. The insulating layer 160 further extends to the sidewall and the bottom of the deep side recess 200a along the sidewall and the bottom of the shallow side recess 200b, as shown in FIG. 1B.

The conducting lines 300 are disposed on the first surface 100a of the semiconductor substrate 100 and on the insulating layer 160 outside of the device region 115. The conducting lines 300 extend to the conducting pads 150 uncovered by the insulating layer 160 and electrically connect thereto. The conducting lines 300 further extend onto the insulating layer 160 on the sidewall and the bottom of the deep side recess 200a along the sidewall and the bottom of the shallow side recess 200b, as shown in FIG. 1B. In the embodiment, each conducting pad 150 is electrically connected to each respective conducting line 300, as shown in FIG. 1A.

Figure 21:
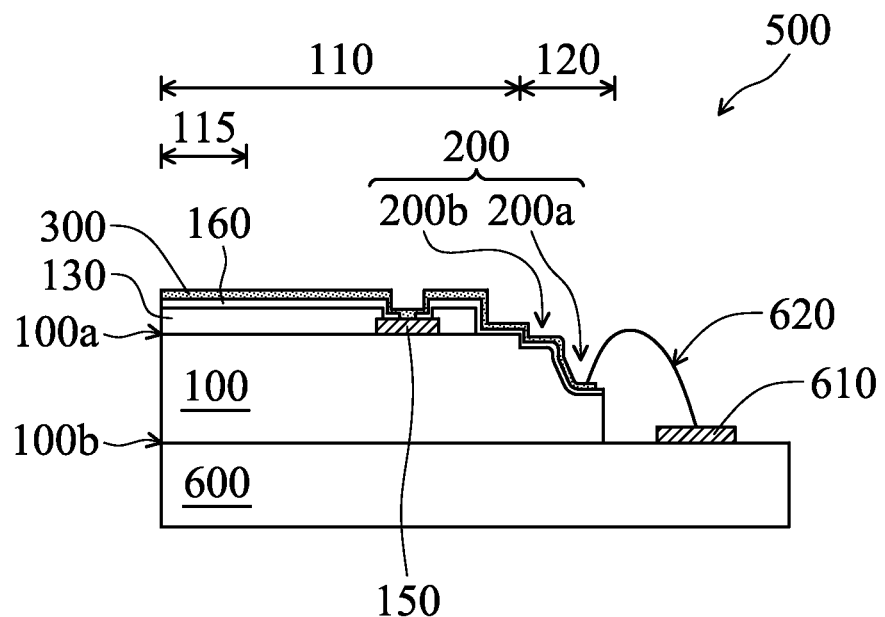
Figure 22:
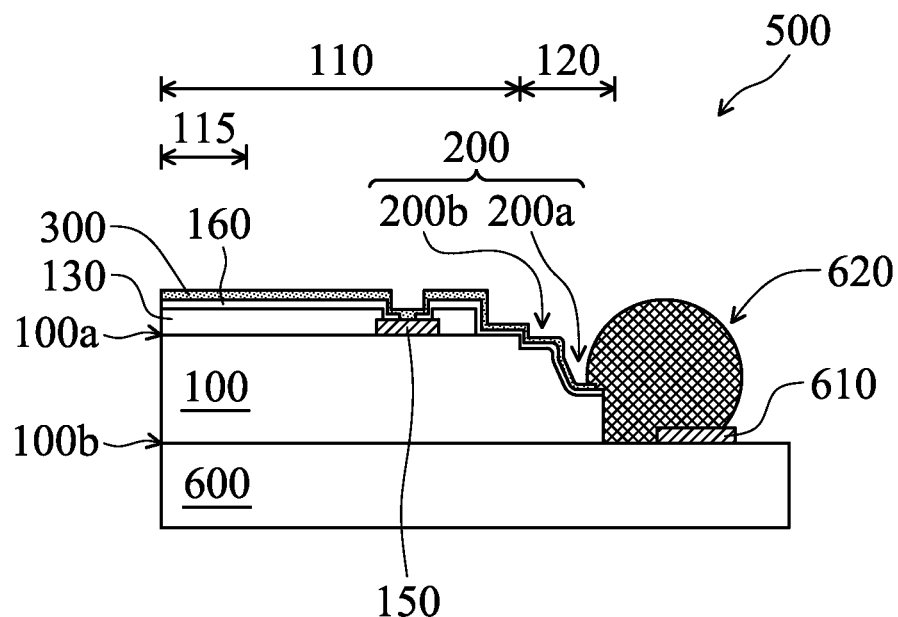

In one embodiment, as shown in FIGS. 21 and 22, the chip package may be further disposed on a circuit board 600. The conducting lines 300 extending to the sidewall and the bottom of the side recess 200 may be electrically connected to a contact pad 610 on the circuit board 600 by a conducting structure 620, such as the wire shown in FIG. 21 and the solder ball shown in FIG. 22.

According to the aforementioned embodiments, the chip package has a side recess 200 on the first side 101, and the upper surface thereof is lower than the first surface 100a of the semiconductor substrate 100. Therefore, when the chip package is electrically connected to the circuit board 600 by the conducting structure 620, the height of the conducting structure 620 is reduced and thereby significantly reducing the overall size of the chip package. In addition, since the side recess 200 crosses the entire length or width of the first side 101 of the semiconductor substrate 100, the layout flexibility for output signals of the chip package is increased.

Referring to FIG. 1A, the deep side recess 200a and the shallow side recess 200b have bottom areas Aa and Ab, respectively. The deep side recess 200a with a bottom closest to the second surface 100b has a bottom area Aa greater than the bottom area Ab of the shallow side recess 200b. In another embodiment, the chip package may comprise three or more continuous side recesses on the same side to form a multi-step side recess, and each side recess has a respective bottom area. The side recess with a bottom closest to the second surface 100b has the greatest bottom area. Since the side recess with the bottom closest to the second surface 100b has the greatest bottom area, various electrical connecting methods can be adopted for the chip package.

As shown in FIG. 1B, the deep side recess 200a and the shallow side recess 200b have recess depths Da and Db between the bottom and the top of the sidewall thereof, respectively. The deep side recess 200a with the bottom closest to the second surface 100b has a recess depth Da greater than the recess depth Db of the shallow side recess 200b. In another embodiment, the chip package may comprise three or more continuous side recesses on the same side to form a multi-step side recess, and each side recess has a recess depth between the bottom and the top of the sidewall thereof, respectively. The side recess with a bottom closest to the second surface 100b has the greatest recess depth. Since the side recess with the bottom closest to the second surface 100b has the greatest recess depth, the available area of chip package can be increased.

FIGS. 2 to 6 are plan views of various exemplary embodiments of arrangements of the side recesses. Elements in FIGS. 2 to 6 that are the same as those in FIG. 1A are labeled with the same reference numbers as in FIG. 1A and are not described again for brevity. Moreover, for the purpose of clarifying the relative position, the insulating layer 160 and the conducting lines 300 are not shown in FIGS. 2 to 6.

Figure 2:
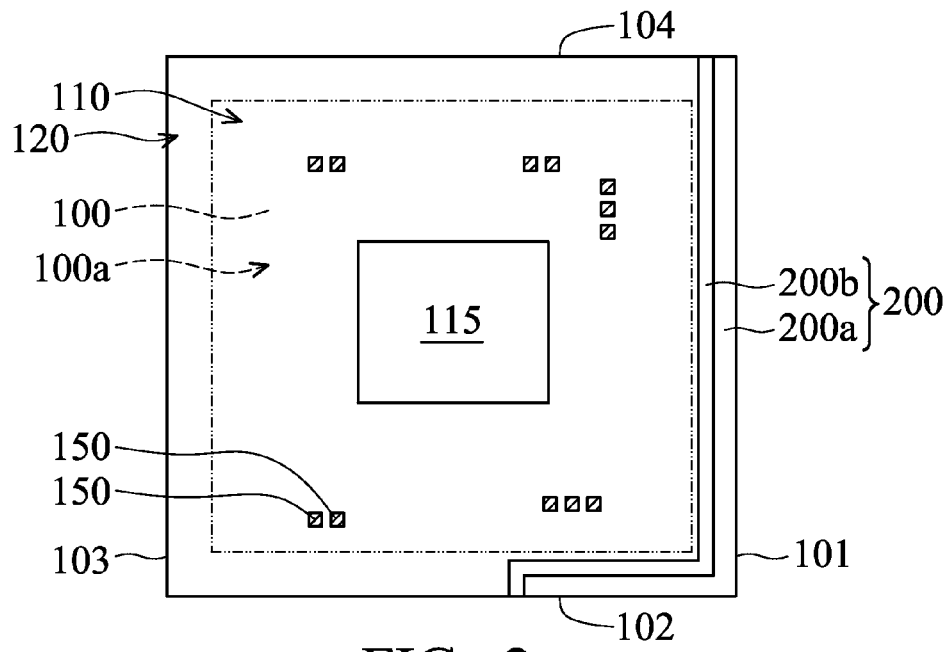
FIGS. 2 to 6 are plan views of various exemplary embodiments of arrangements of side recesses.
Figure 3:
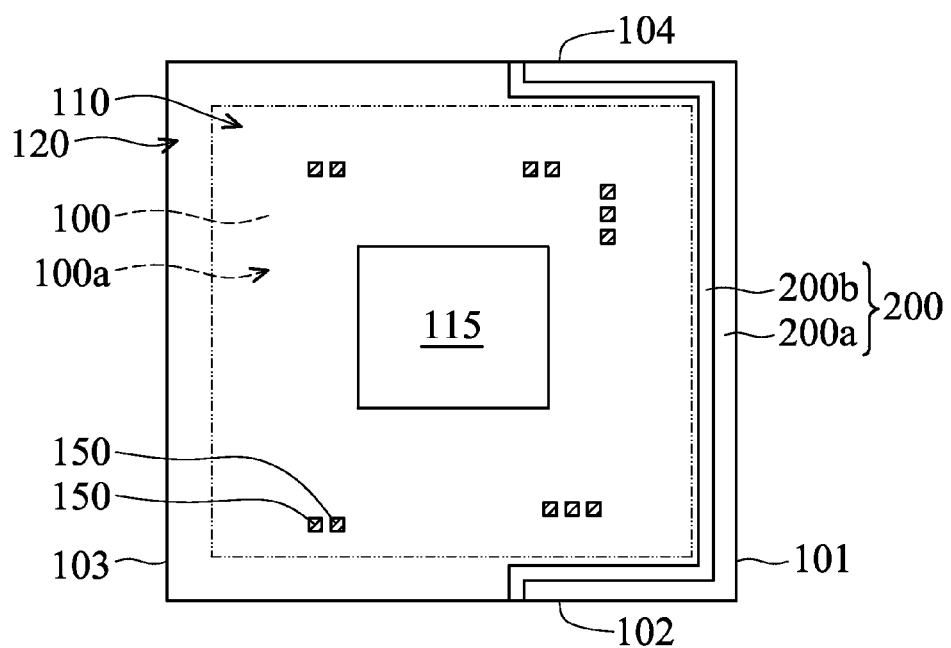

FIG. 2 illustrates the side recess 200 across the entire length of the first side 101 and further extending to at least a portion of a second side 102 adjacent to the first side 101. FIG. 3 illustrates the side recess 200 across the entire length of the first side 101 and further extending to at least a portion of each of two sides 102 and 104 adjacent to the first side 101. In other embodiments, the side recess 200 may extend continuously across the entire length of two, three or four sides of the semiconductor substrate 100.

Figure 4:
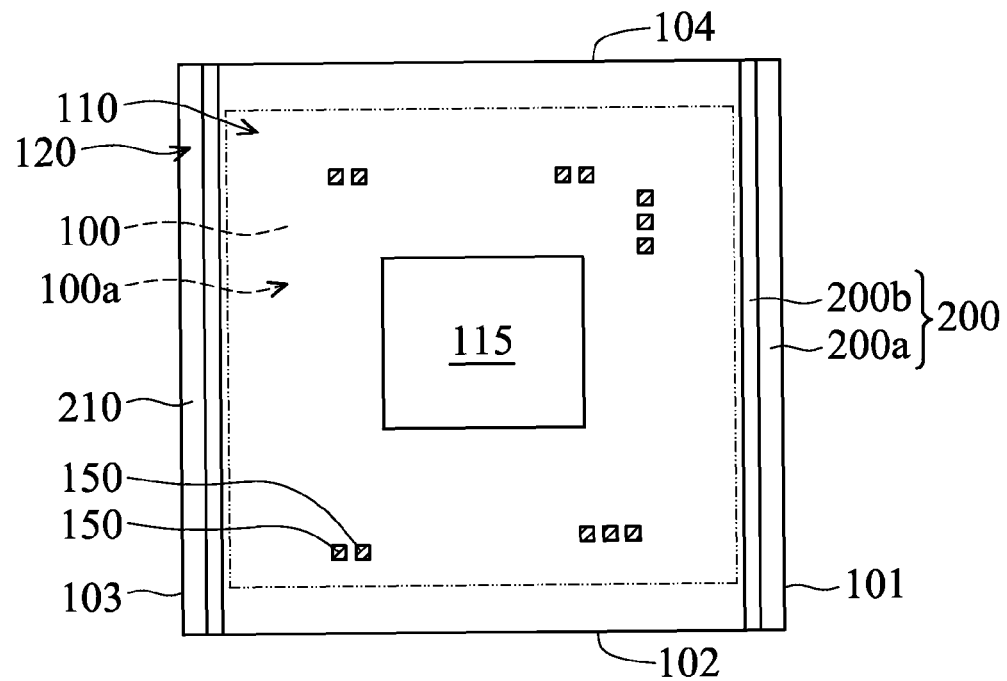
Figure 5:
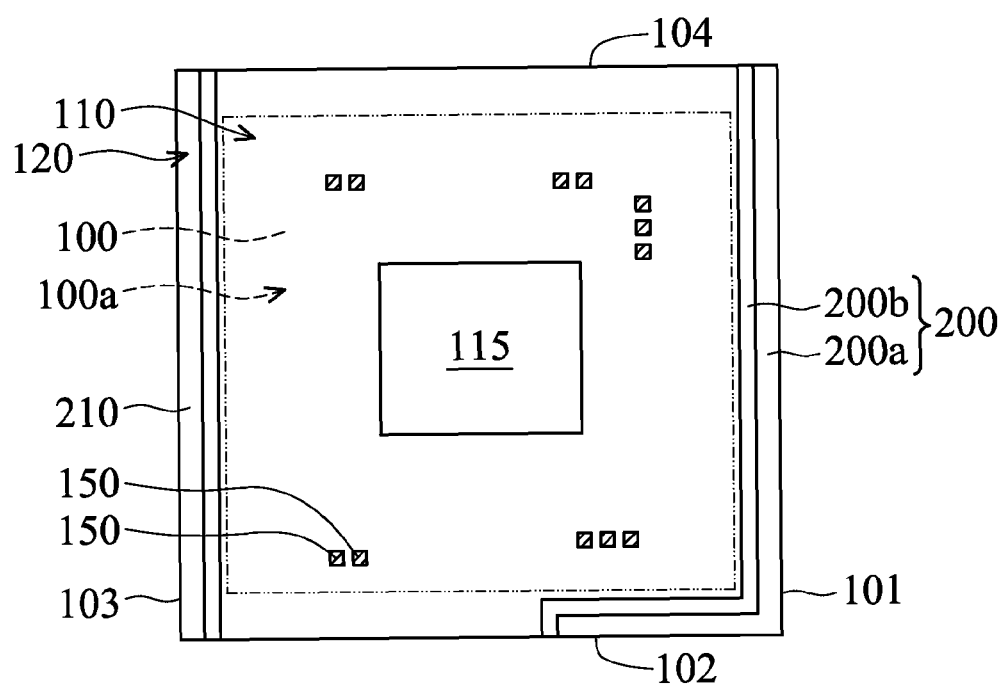
Figure 6:
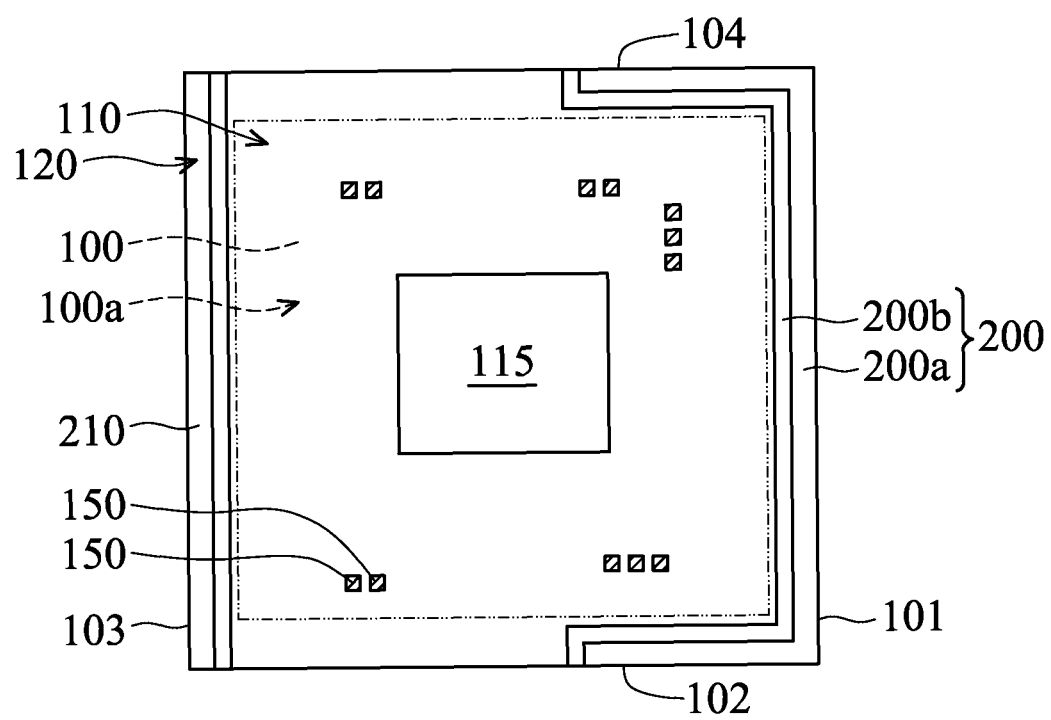

FIG. 4 illustrates an exemplary embodiment of the chip package comprising two individual side recesses 200 and 210. The side recesses 200 and 210 are at opposite sides 101 and 103 of the semiconductor substrate 100, respectively. Moreover, the side recesses 200 and 210 extend across the entire length of the sides 101 and 103 of the semiconductor substrate 100, respectively. Similarly, the side recesses 200 and 210 may further extend to at least a portion of the second side 102 adjacent thereto or at least a portion of each of two sides 102 and 104 adjacent thereto. For example, as shown in FIG. 5, the side recess 200 further extends to at least a portion of the second side 102 adjacent thereto. As shown in FIG. 6, the side recess 200 further extends to at least a portion of each of two sides 102 and 104 adjacent thereto. Therefore, although not shown in the figures, those skilled in the art will appreciate that the side recesses 200 and 210 may have other configurations as long as the side recess extends across the full length or width of one side of the semiconductor substrate 100.

Figure 7A:
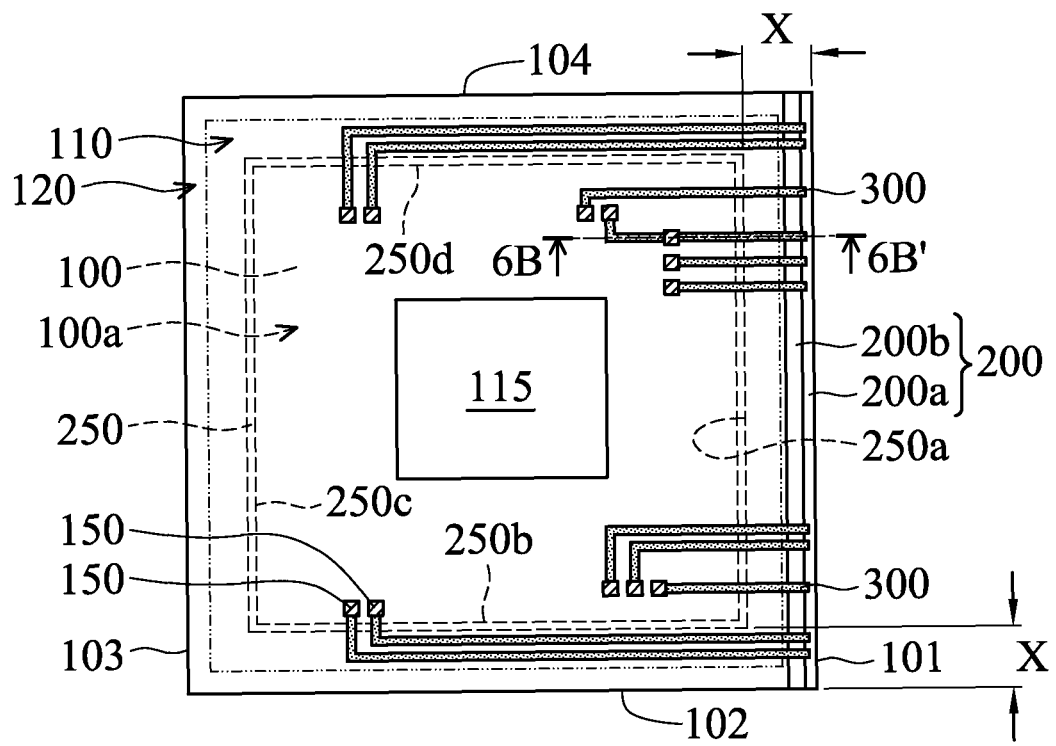
FIGS. 7A and 8A are plan views of various exemplary embodiments of the chip package having a seal ring.
Figure 7B:
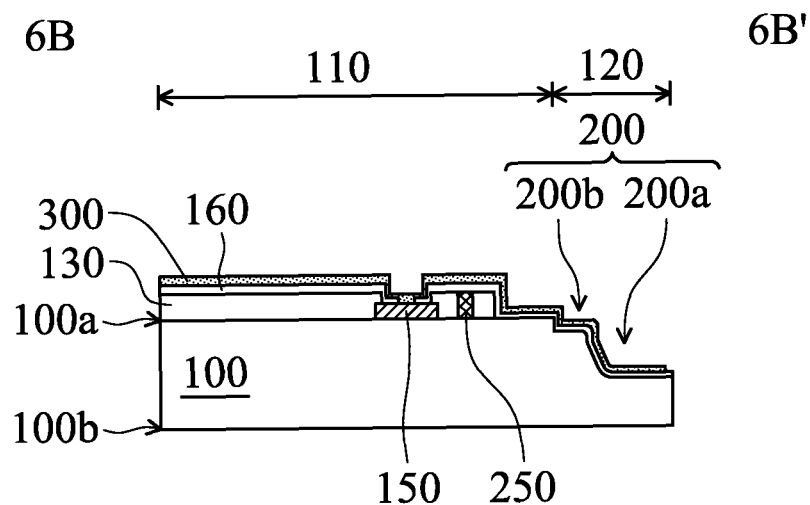
FIGS. 7B and 8B are cross-sectional views along the lines 7B-7B' and 8B-8B' in FIGS. 7A and 8A, respectively.
Figure 8A:
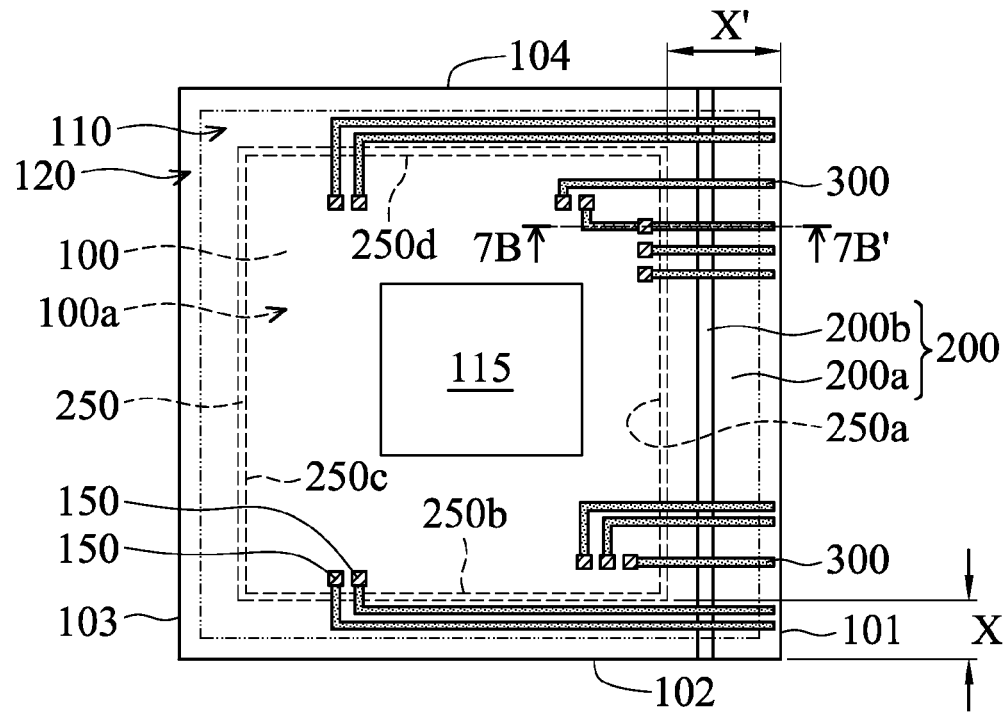
Figure 8B:
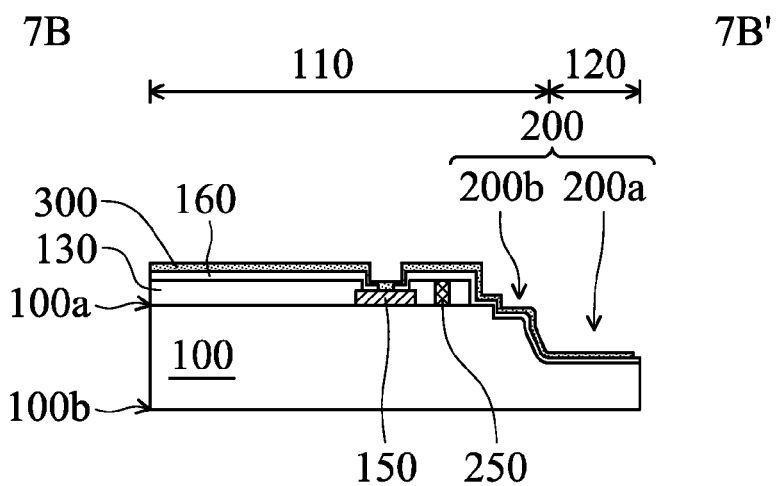

Various exemplary embodiments of the chip package having a seal ring are illustrated in FIGS. 7A, 7B, 8A and 8B, in which FIGS. 7A and 8A are plan views of the chip package having the seal ring, and FIGS. 7B and 8B are cross-sectional views along the lines 7B-7B' and 8B-8B' in FIGS. 7A and 8A, respectively. Elements in FIGS. 7A, 7B, 8A and 8B that are the same as those in FIGS. 1A and 1B are labeled with the same reference numbers as in FIGS. 1A and 1B and are not described again for brevity.

Referring to FIGS. 7A and 7B, the chip package further comprises a seal ring 250 disposed in the dielectric layer 130 on the first surface 100a of the semiconductor substrate 100, and between the semiconductor substrate 100 and the insulating layer 160. The seal ring 250 is rectangular and surrounds the conducting pads 150. The conducting lines 300 extend across the seal ring 250 to the side recess 200. In one embodiment, the seal ring 250 comprises a conductive material. In the embodiment of FIGS. 7A and 7B, the side recess 200 is only in the predetermined scribe region 120, each of the distances X between the side 250a of the seal ring 250 and the side 101 of the semiconductor substrate 100, between the side 250b of the seal ring 250 and the side 102 of the semiconductor substrate 100, between the side 250c of the seal ring 250 and the side 103 of the semiconductor substrate 100, and between the side 250d of the seal ring 250 and the side 104 of the semiconductor substrate 100 are the same.

In the embodiment of FIGS. 7A and 7B, since the side recess 200 is only in the predetermined scribe region 120 without occupying the area of the chip region 110, the available area of the semiconductor wafer is increased, such that the semiconductor substrate 100 has a greater layout area to integrate more elements, thereby improving the performance of the chip package. In one embodiment, a dicing process may be performed by a thinner cutting blade to retain portions of the semiconductor substrate 100 corresponding to the predetermined scribe region 120 and the formed side recess 200.

The chip package shown in FIGS. 8A and 8B has a structure similar to that shown in FIGS. 7A and 7B, and the difference therebetween is that the side recess 200 is not only in the predetermined scribe region 120 but it also extends into the chip region 110, such that the side 250a of the seal ring 250 adjacent to the first side 101 has a distance X' between the side 250a and the first side 101. The distance X' is greater than each distance X between the other three sides 250b, 250c and 250d of the seal ring 250 and the other corresponding three sides 102, 103 and 104 of the semiconductor substrate 100.

Figure 10:
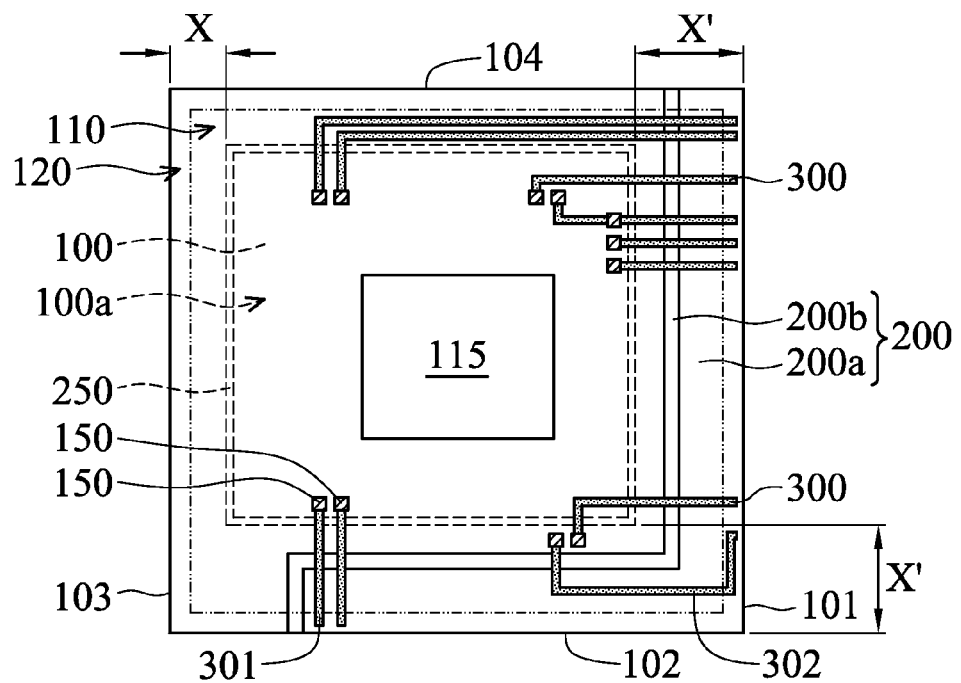

It is noted that the arrangements of the seal ring shown in FIGS. 7A, 7B, 8A and 8B and the aforementioned arrangements of the side recess shown in FIGS. 1A, 1B and 2 to 6 may be combined with each other to form various embodiments. For example, as shown in FIG. 10, when the arrangement of the seal ring shown in FIGS. 8A and 8B and the arrangements of the side recess shown in FIG. 2 are combined with each other, the side recess 200 extends to at least a portion of the second side 102 adjacent to the first side 101 and further extends into the chip region 110, such that the distance X' between the first side 101 and the side 250a of the seal ring 250 adjacent thereto, or between the second side 102 and the side 250b of the seal ring 250 adjacent thereto, is greater than each distance X between the remaining two sides 250c and 250d of the seal ring 250 and the rest of the corresponding sides 103 and 104 of the semiconductor substrate 100.

Figure 9:
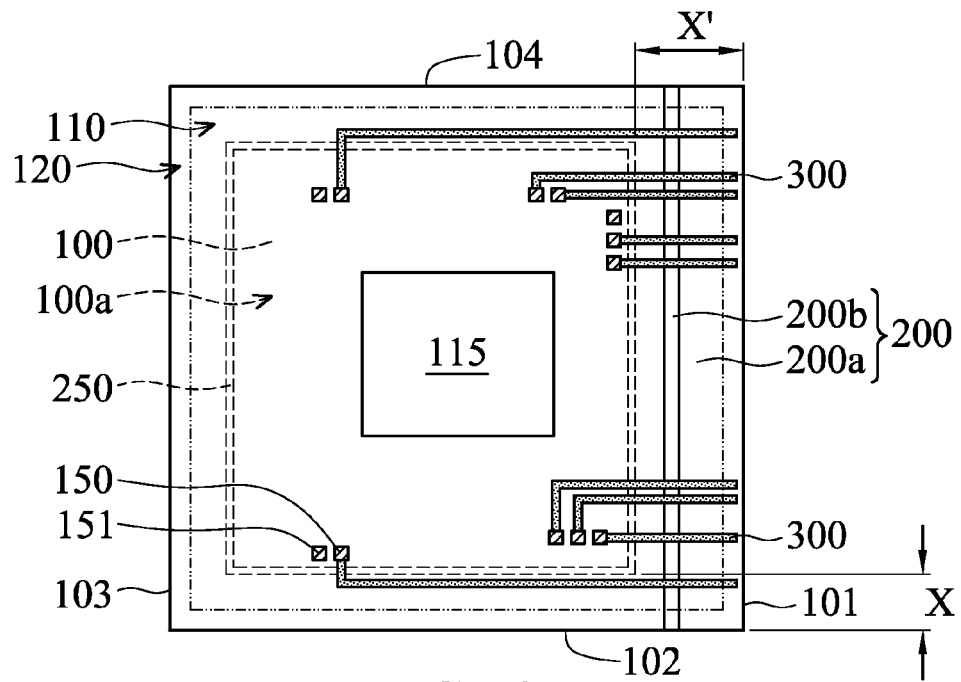
FIGS. 9 to 12 are plan views of various exemplary embodiments of the conducting layer.

Referring to FIG. 9, a conducting pad 151 is not electrically connected to the conducting line 300 and may form an outer electrically connecting structure by mounting a solder ball. Referring to FIG. 10, when the side recess 200 crosses the entire length of the first side 101 and further extends to at least a portion of the second side 102 adjacent to the first side 101, a conducting line 301 directly extends to the side recess 200 on the second side 102 and further is electrical connected to other elements, such as a contact pad on a circuit board, by other electrically connecting structures, such as a wire or a solder ball. As a result, the connective path of the conducting lines can be significantly reduced, the speed of transmitting signals can be increased, and the occupied surface area of the semiconductor substrate 100 can be reduced.

In one embodiment, a conducting line 302 extends to the side recess 200 on the second side 102 and further extends from the side recess 200 on the second side 102 to the side recess 200 on the first side 101. Therefore, the layout flexibility of the conducting lines can be increased, and the occupied surface area of the semiconductor substrate 100 can be reduced.

Figure 11:
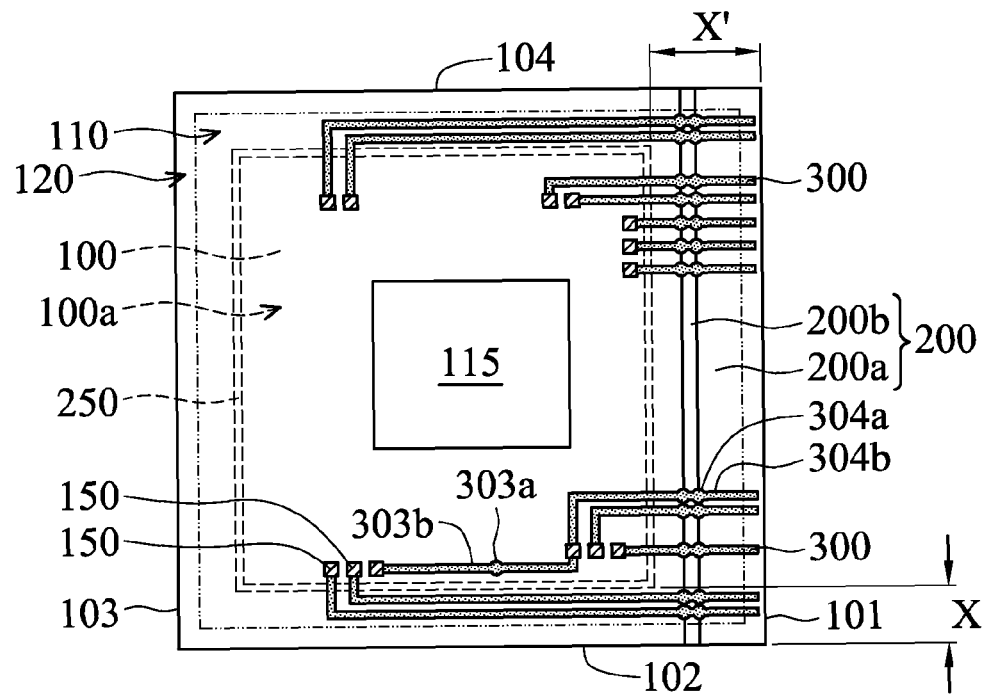

Referring to FIG. 11, in one embodiment, the insulating layer 160 of the chip package may have protrusions or trenches. The conducting line 300 extending onto the protrusions of the insulating layer 160 or into the trenches of the insulating layer 160 may comprise a first portion 303a adjacent to the protrusions or the trenches, and a second portion 303b connected to the first portion 303a. The first portion 303a has a width greater than that of the second portion 303b. In another embodiment, the conducting line 300 comprises a first portion 304a adjacent to the top and the bottom of the sidewall of the side recess 200a, and a second portion 304b connected to the first portion 304a. The first portion 304a has a width greater than that of the second portion 304b. Therefore, the conducting lines 300 can be prevented from being broken, thereby improving the reliability thereof.

Figure 12:
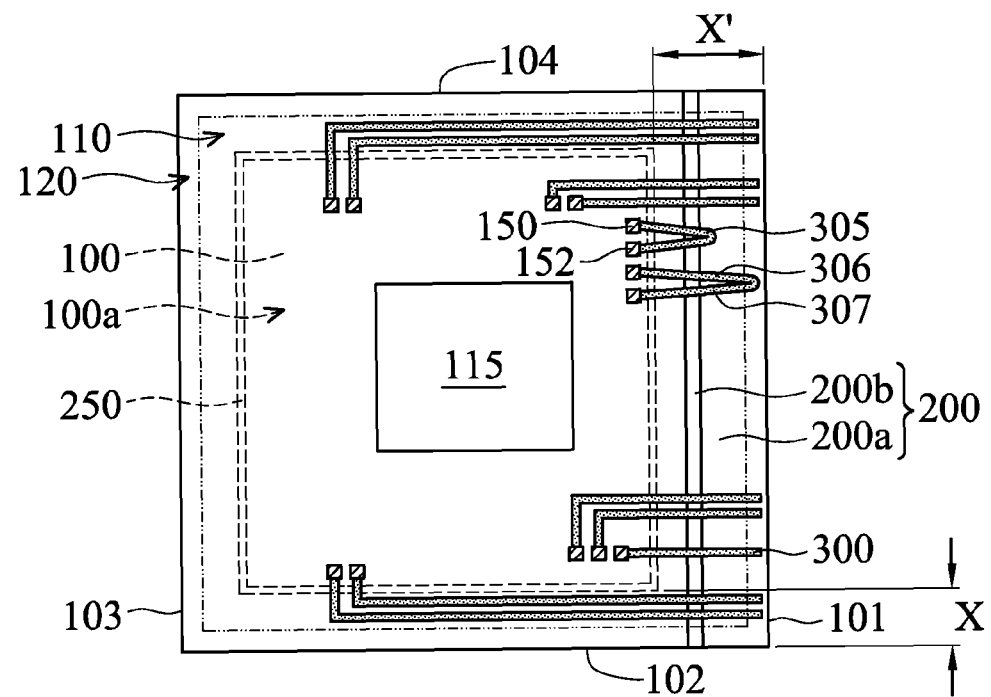

Referring to FIG. 12, in one embodiment, a conducting line 305 extending to the side recess 200 is electrically connected to two conducting pads 150 and 152. In one embodiment, two conducting lines 306 and 307 extending to the side recess 200 may be in electrical contact with each other.

Those skilled in the art will appreciate that the embodiments of FIGS. 9 to 12 and the aforementioned arrangements of the side recess shown in FIGS. 1A, 1B, 2 to 6, 7A, 7B, 8A and 8B may be combined with each other. Although not shown in the figures, the conducting lines and conducting pads may have other configurations as long as the side recess extends across the entire length or width of one side of the semiconductor substrate 100.

Figure 13:
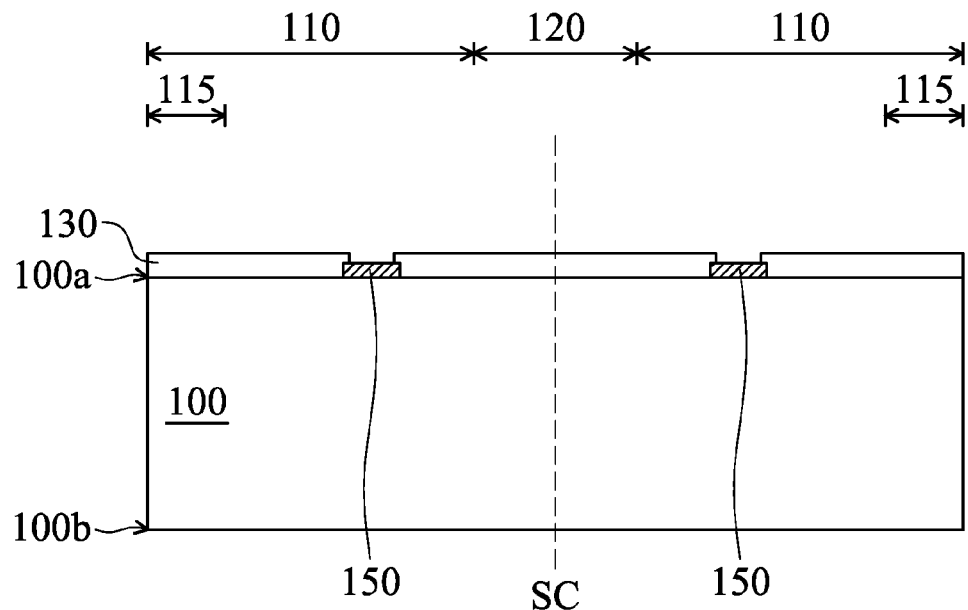
Figure 14A:
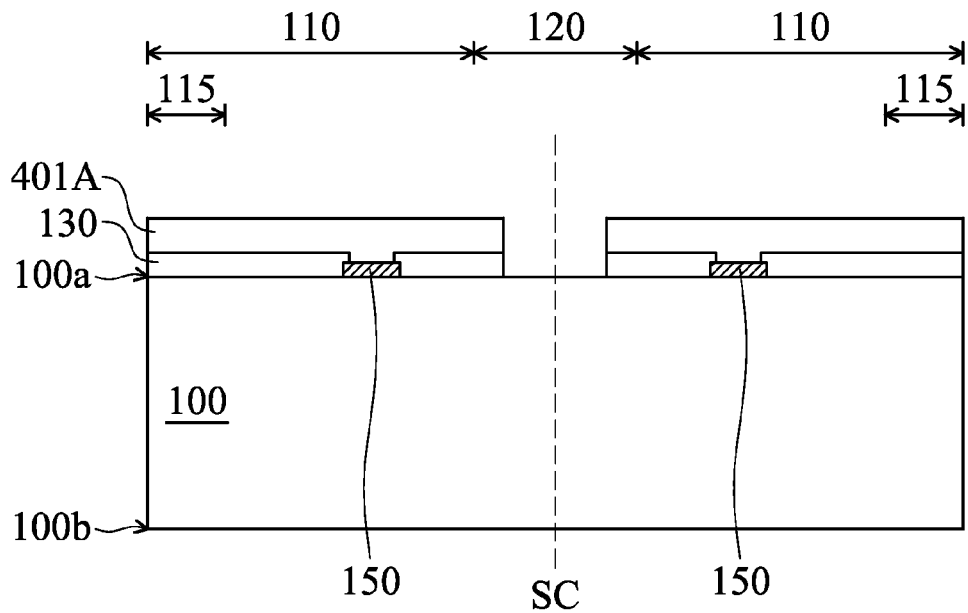
Figure 14B:
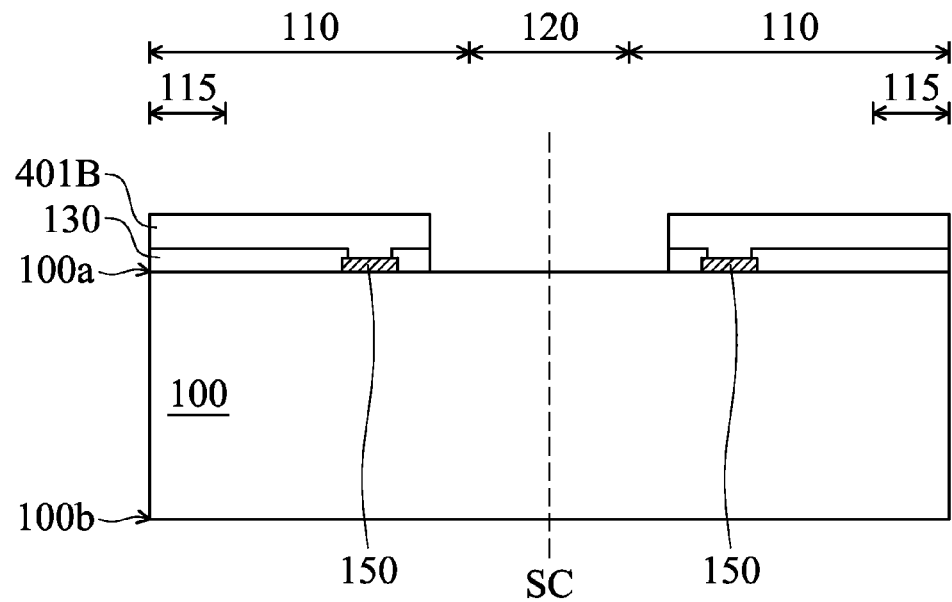
FIGS. 14B, 15B and 16B are cross-sectional views of another exemplary embodiment different from the exemplary embodiment in FIGS. 14A, 15A, 16A-1 and 16A-2.
Figure 15A:
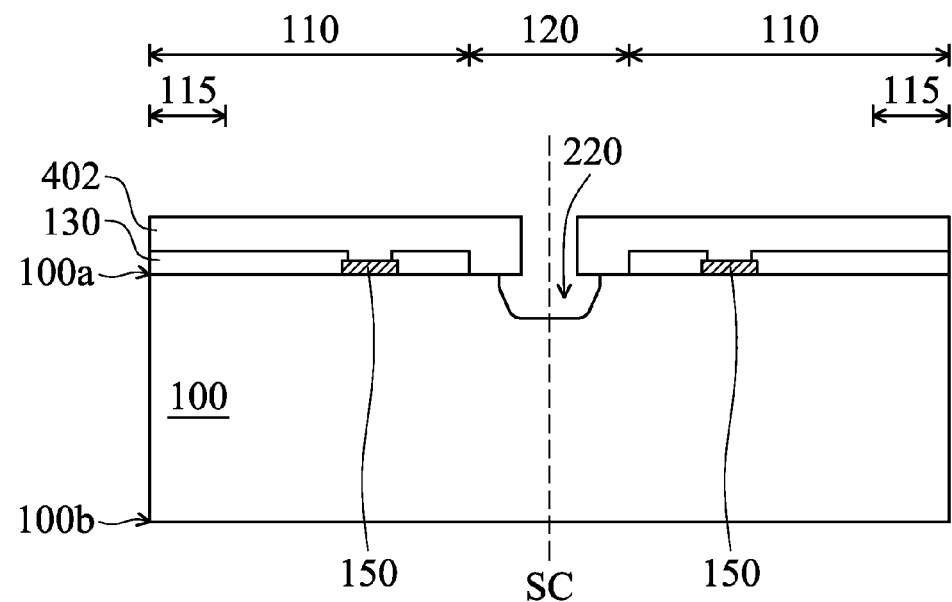
Figure 15B:
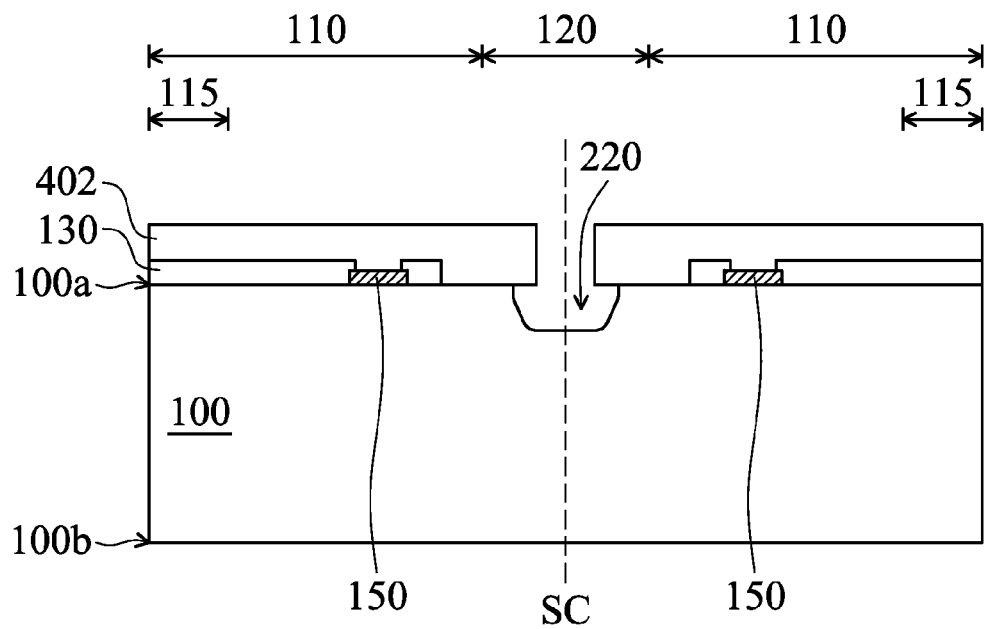
Figures 1, 16A:
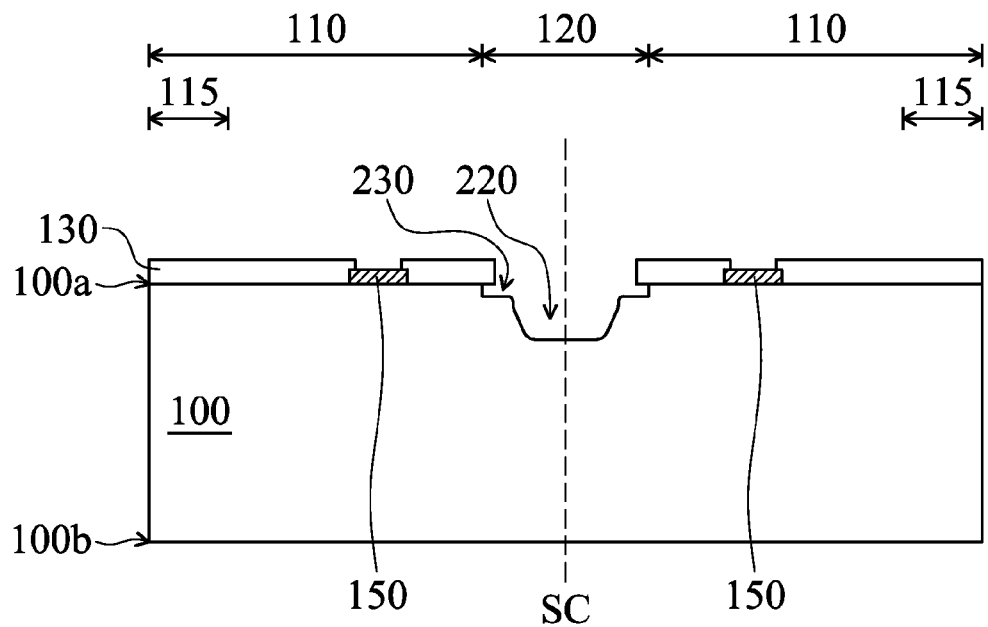
Figures 2, 16A:
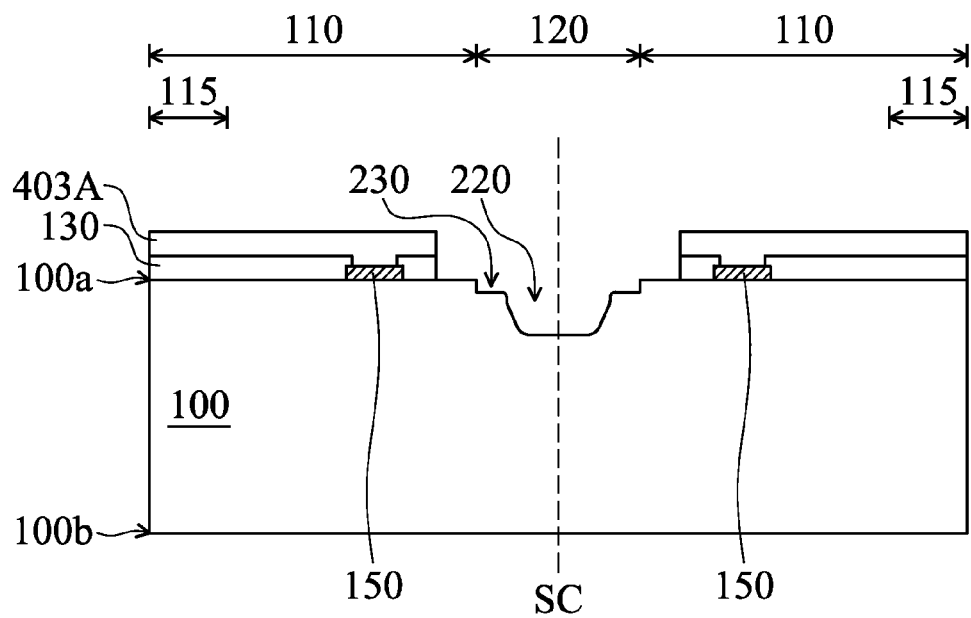
Figure 16B:
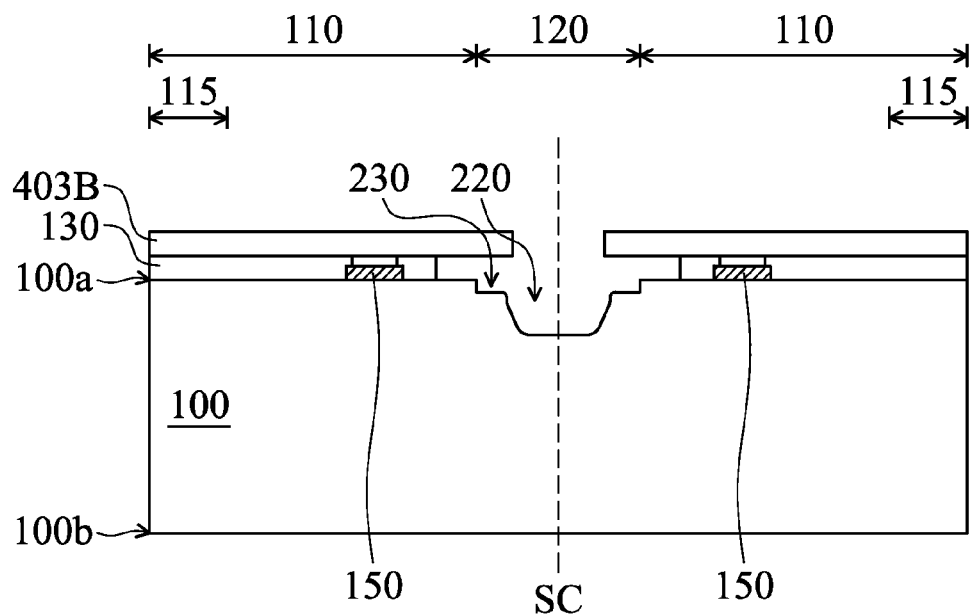

Exemplary embodiments of a method for forming a chip package according to the invention are illustrated with FIGS. 13, 14A, 14B, 15A, 15B, 16A-1, 16A-2, 16B and 17-22, in which FIGS. 13, 14A, 15A, 16A-1, 16A-2 and 17-22 are cross-sectional views of an exemplary embodiment of a method for forming a chip package according to the invention, and FIGS. 14B, 15B and 16B are cross-sectional views of another exemplary embodiment which is different from the exemplary embodiment in FIGS. 14A, 15A, 16A-1 and 16A-2.

Referring to FIG. 13, a semiconductor substrate 100, such as a semiconductor wafer, is provided. The semiconductor substrate 100 has a first surface 100a and a second surface 100b, and comprises a plurality of chip regions 110 and a predetermined scribe region 120 separating the plurality of chip regions 110, in which a scribe line SC is defined in the predetermined scribe region 120. Each chip region 110 comprises a device region 115 therein. The device region 115 may include (but is not limited to) a sensor device, such as an image sensor device. In one embodiment, the semiconductor substrate 100 is a silicon wafer so as to facilitate the wafer-level packaging process.

Conducting pads 150 are disposed on the first surface 100a of the semiconductor substrate 100 corresponding to the chip region 110. The conducting pads 150 may comprise one conducting layer or multiple conducting layers, and may be electrically connected to the device region 115 by inner circuits (not shown).

A dielectric layer 130 is formed on the first surface 100a of the semiconductor substrate 100 corresponding to the chip region 110, and may comprise a stack of multiple dielectric layers and/or an overlying passivation layer. The dielectric layer 130 has openings exposing the conducting pads 150.

Referring to FIG. 14A, a masking layer 401A, such as a patterned photoresist layer, is formed on the dielectric layer 130. The masking layer 401A has openings exposing the dielectric layer 130 corresponding to the predetermined scribe region 120. Next, an etching process is performed to remove a first portion of the dielectric layer 130 and expose portions of the semiconductor substrate 100 corresponding to the predetermined scribe region 120.

Next, referring to FIG. 15A, after the masking layer 401A is removed, a masking layer 402 having openings exposing portions of the semiconductor substrate 100 corresponding to the predetermined scribe region 120 is formed on the dielectric layer 130. Next, an etching process is performed to remove the exposed portions of the semiconductor substrate 100 to form a recess 220. In one embodiment, a dry etching process with a defined etch angle may be used to form the recess 220.

The recess 220 is in the predetermined scribe region 120 and extends from the first surface 100a toward the second surface 100b and under portions of the masking layer 402. In one embodiment, the sidewalls and the bottom of the formed recess 220 may be rough and uneven, and have a jagged contour.

Next, referring to FIG. 16A-1, after the masking layer 402 is removed, an etching process, such as a blanket etching process, is optionally performed to smooth the sidewalls and the bottom of the recess 220. In one embodiment, during the smoothing of the sidewalls and the bottom of the recess 220, the etching process may remove portions of the semiconductor substrate 100 underlying the dielectric layer 130, thereby forming another recess 230. The recesses 220 and 230 having the smoothed sidewalls and bottoms can facilitate the subsequent formation of material layers thereon.

Next, referring to FIG. 16A-2, a masking layer 403A having openings exposing the recesses 220 and 230 and exposing a second portion of the dielectric layer 130 is formed on the dielectric layer 130. Next, an etching process is performed to remove the second portion of the dielectric layer 130, and expose the recesses 220 and 230 and portions of the semiconductor substrate 100 corresponding to the chip region 110. In one embodiment, the exposed first surface 100a of the semiconductor substrate 100 has a plane substantially parallel to that of the bottoms of the recesses 220 and 230.

FIGS. 14B, 15B and 16B are cross-sectional views of another exemplary embodiment which is different from the exemplary embodiment in FIGS. 14A, 15A, 16A-1 and 16A-2. The openings of the masking layer 401B shown in FIG. 14B are greater than those of the masking layer 401A shown in FIG. 14A so as to simultaneously remove the first and second portions of the dielectric layer 130. Next, as shown in FIG. 15B, after the masking layer 401B is removed, a masking layer 402 is formed on the dielectric layer 130, and an etching process is performed to form the recess 220. In one embodiment, a tilted dry etching process may be used to form the recess 220.

Next, referring to FIG. 16B, after the masking layer 402 is removed, a patterned masking layer 403B is formed on the dielectric layer 130, and an etching process, such as a blanket etching process, is performed to smooth the contours of the sidewalls and the bottom of the recess 220. In one embodiment, during the smoothing of the contours of the sidewalls and the bottom of the recess 220, the etching process may remove a portion of the semiconductor substrate 100, thereby forming another recess 230.

Figure 17:
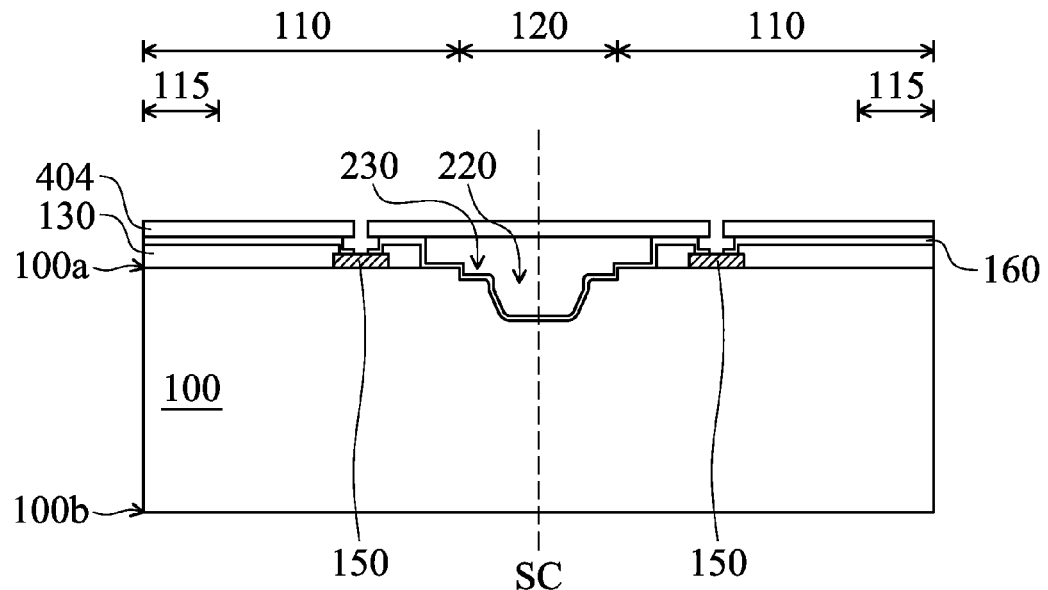

Next, referring to FIG. 17, after the masking layer 403A or the patterned masking layer 403B is removed, an insulating layer 160 is formed on the dielectric layer 130. The insulating layer 160 extends into the openings of the dielectric layer 130 to cover the conducting pads 150, and further extends to the sidewalls and the bottom of the recess 220 along the sidewalls and the bottom of the recess 230. Next, a masking layer 404 having openings exposing portions of the insulating layer 160 on the conducting pads 150 is formed on the insulating layer 160, and an etching process is performed to remove the portions of the insulating layer 160 and expose portions of the conducting pads 150.

Figure 18:
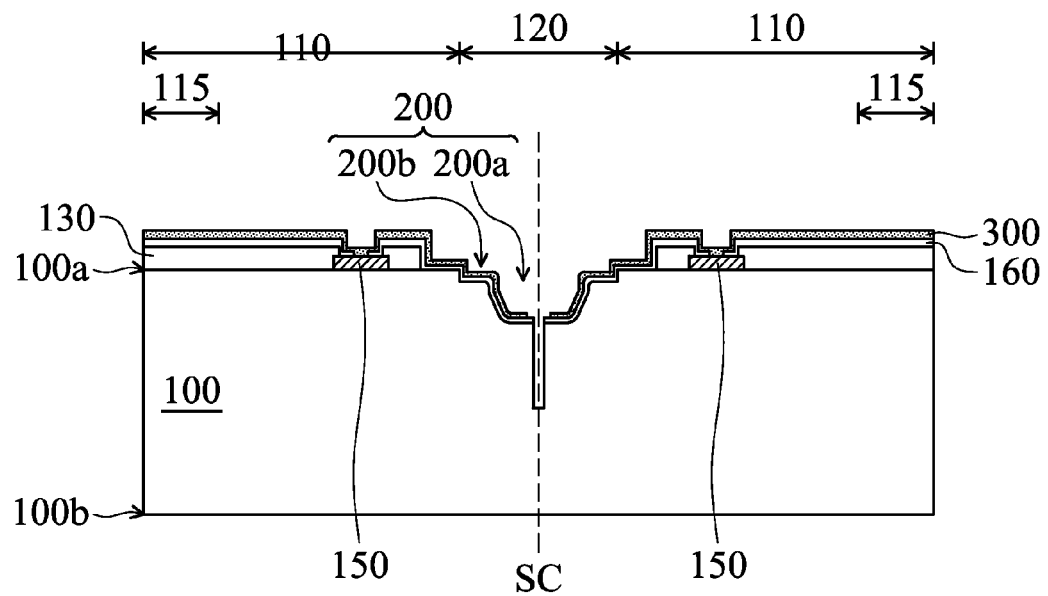

Next, referring to FIG. 18, after the masking layer 404 is removed, conducting lines 300 are formed on the insulating layer 160. The conducting lines 300 extend to the exposed conducting pads 150 to electrically connect thereto, and further extend onto the insulating layer 160 on the sidewalls and the bottom of the recess 220. In one embodiment, the conducting lines 300 do not overlap the scribe line SC so as to facilitate the subsequent dicing process.

Next, portions of the insulating layer 160 and the semiconductor substrate 100 are removed from the first surface 100a of the semiconductor substrate 100 toward the second surface 100b along the scribe line SC to form a trench of the scribe line SC. The trench of the scribe line SC passes through the bottom of the recess 220, such that the recess 220 is diced to form separated deep side recesses 200a, and the recess 230 is diced to form separated shallow side recesses 200b. A step-form side recess 200 is composed of the deep side recess 200a and the shallow side recess 200b.

It is realized that the actual number of side recesses is determined by design demands. For example, in one embodiment, the blanket etching process is not performed and a cliff-form side recess composed of the deep side recesses 200a is formed in the semiconductor substrate 100. In another embodiment, a multi-step side recess composed of three or more continuous side recesses may be formed in the semiconductor substrate 100 by performing several etching processes.

Figure 19:
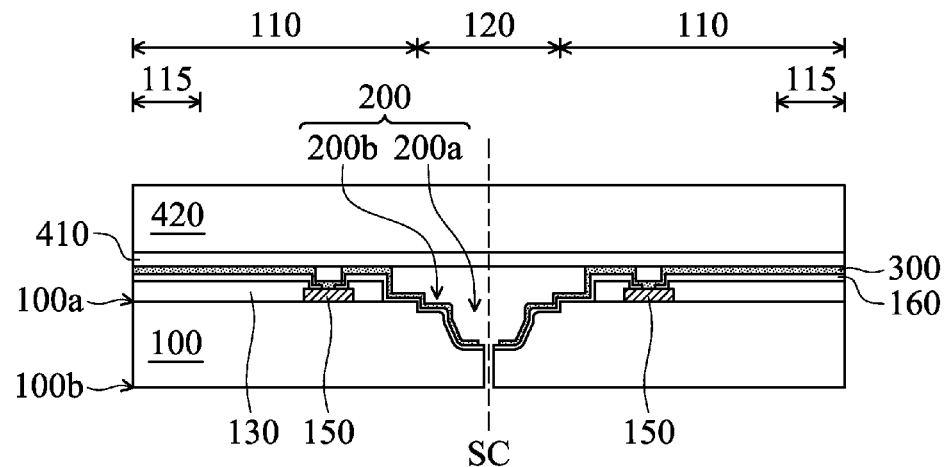

Referring to FIG. 19, a temporary substrate 420 is fixed on the first surface 100a of the semiconductor substrate 100 by an adhesive layer 410. A thinning process, such as a mechanical grinding process or a chemical-mechanical polishing process, is performed on the second surface 100b of the semiconductor substrate 100 by using the temporary substrate 420 as a support, so as to reduce the thickness of the semiconductor substrate 100 and expose the trench of the scribe line SC, thereby forming a plurality of chip packages separated from each other. In one embodiment, the temporary substrate 420 may be a glass substrate or a silicon wafer.

Figure 20:
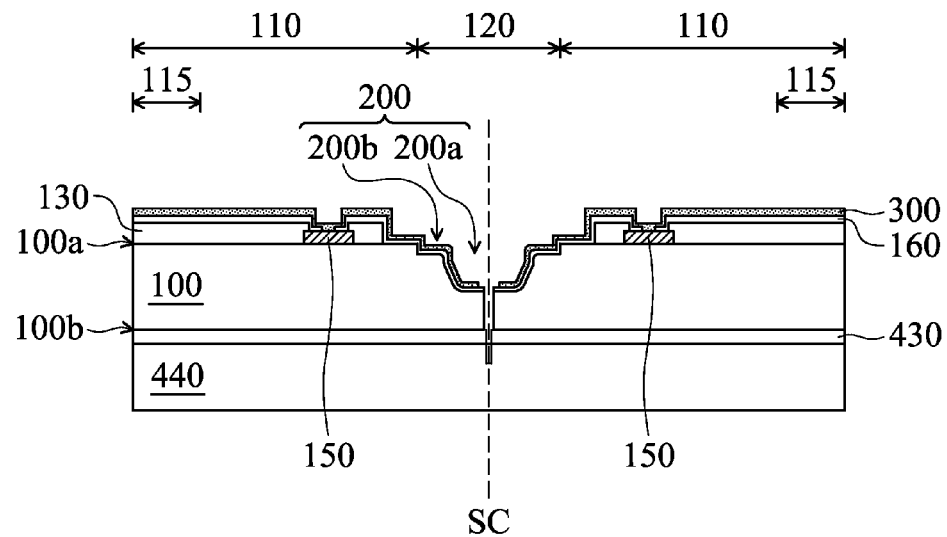

Referring to FIG. 20, an adhesive layer 430 and a carry substrate 440 are disposed on the second surface 100b of the semiconductor substrate 100, and the adhesive layer 410 and the temporary substrate 420 are removed. In one embodiment, only the surface of the adhesive layer 430 facing the first surface 100a of the semiconductor substrate 100 is adhesive. In one embodiment, a dicing process is performed along the scribe line SC, and portions of the adhesive layer 430 and the carry substrate 440 are removed to separate the plurality of chip packages 500.

In one embodiment, referring to FIG. 21, a circuit board 600 may be further disposed on the second surface 100b of the semiconductor substrate 100 of the chip package 500. Moreover, the conducting line 300 extending to the side recess 200 are electrically connected to a contact pad 610 on the circuit board 600 by a conducting structure 620, such as a wire. In another embodiment, as shown in FIG. 22, the conducting structure 620 may be a solder ball. In other embodiments, a conducting layer, a lumped conducting element, other suitable conducting structures or combinations thereof may be used as the conducting structure 620.

According to the aforementioned methods for forming a chip package, each chip package 500 has a side recess 200 on the first side 101 of the semiconductor substrate 100 of the chip package 500 and across at least the entire length of the first side 101, as shown in FIG. 1A. Since the side recess 200 has an upper surface that is lower than the first surface 100a of the semiconductor substrate 100, the height of the conducting structure 620 is reduced when the chip package is electrically connected to the circuit board 600 by the conducting structure 620, thereby significantly reducing the overall size of the chip package. In addition, since the side recess 200 crosses the entire length or width of the first side 101 of the semiconductor substrate 100, the layout flexibility of the output signals of the chip package is increased.

Those skilled in the art will appreciate that the aforementioned methods for forming the chip package may be implemented to the aforementioned various embodiments of the chip package shown in FIGS. 1A and 1B, 2 to 6, 7A and 7B, 8A and 8B, and 9 to 12.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
   a semiconductor substrate having a first surface and a second surface opposite thereto;
   a dielectric layer overlying the first surface of the semiconductor substrate, wherein the dielectric layer comprises an opening exposing a conducting pad;
   a side recess on at least a first side of the semiconductor substrate, wherein the side recess extends from the first surface toward the second surface;
   an upper recess on at least a first side of the dielectric layer outside the conducting pad, wherein sidewalls of the upper recess and the side recess are non-coplanar with each other; and
   a conducting layer electrically connected to the conducting pad and extending to the upper recess and the side recess.

2. The chip package as claimed in claim 1, wherein the side recess further extends to at least a portion of a second side adjacent to the first side.

3. The chip package as claimed in claim 2, wherein the conducting layer extends to the side recess on the second side.

4. The chip package as claimed in claim 3, wherein the conducting layer further extends from the side recess on the second side to the side recess on the first side.

5. The chip package as claimed in claim 1, wherein the side recess further extends to at least a portion of each of two sides adjacent to the first side.

6. The chip package as claimed in claim 1, wherein the chip package comprises two individual side recesses on two opposite sides of the semiconductor substrate and across each entire length of the corresponding sides.

7. The chip package as claimed in claim 6, wherein at least one of the two side recesses further extends to at least a portion of a side adjacent thereto.

8. The chip package as claimed in claim 6, wherein at least one of the two side recesses further extends to at least a portion of each of two sides adjacent thereto.

9. The chip package as claimed in claim 1, wherein the chip package comprises a plurality of continuous recesses outside the conducting pad, and wherein each recess has a recess depth between a bottom and a top of a sidewall thereof, and a first recess with a bottom closest to the second surface has a greatest recess depth.

10. The chip package as claimed in claim 1, wherein the chip package comprises a plurality of continuous recesses outside the conducting pad, and wherein each recess has a bottom area, and a first recess with a bottom closest to the second surface has a greatest bottom area.

11. The chip package as claimed in claim 1, further comprising a seal ring surrounding the conducting pad, wherein the seal ring is rectangular, and wherein the conducting layer extends across the seal ring to the upper recess and the side recess.

12. The chip package as claimed in claim 11, wherein each of distances between each side of the seal ring and a corresponding side of the semiconductor substrate is the same.

13. The chip package as claimed in claim 11, wherein a distance between the first side and one side of the seal ring adjacent thereto is greater than each of distances between other three sides of the seal ring and other three corresponding sides of the semiconductor substrate.

14. The chip package as claimed in claim 1, further comprising an insulating layer disposed under the conducting layer and on the dielectric layer and the semiconductor substrate, wherein the conducting layer extends onto a protrusion of the insulating layer or into a trench of the insulating layer, and the conducting layer comprises a first portion adjacent to the protrusion or the trench and a second portion connected to the first portion, and wherein the first portion has a width greater than that of the second portion.

15. The chip package as claimed in claim 1, wherein the conducting layer comprises a first portion adjacent to a top and a bottom of a sidewall of the upper recess or the side recess and a second portion connected to the first portion, and wherein the first portion has a width greater than that of the second portion.

16. The chip package as claimed in claim 1, wherein the conducting layer is further electrically connected to an another conducting pad.

17. The chip package as claimed in claim 1, wherein the upper recess exposes the first surface of the semiconductor substrate.

18. The chip package as claimed in claim 17, wherein the conducting layer comprises a first portion and a second portion connected to the first portion, and wherein the first portion has a lateral width greater than that of the second portion.

19. The chip package as claimed in claim 1, wherein the conducting layer comprises a first portion and a second portion connected to the first portion, and wherein the first portion has a lateral width greater than that of the second portion.

20. The chip package as claimed in claim 19, further comprising a circuit board, wherein the conducting layer is electrically connecting a contact pad on the circuit board by a conducting structure.

21. The chip package as claimed in claim 20, wherein the conducting structure comprises a wire or a solder ball.

22. The chip package as claimed in claim 20, wherein the conducting structure is lower than the conducting layer above the upper recess.

23. A chip package, comprising:
a semiconductor substrate having a first surface and a second surface opposite thereto;
a dielectric layer overlying the first surface of the semiconductor substrate, wherein the dielectric layer comprises an opening exposing a conducting pad;
a seal ring surrounding the conducting pad, wherein the seal ring is rectangular;
a side recess on at least a first side of the semiconductor substrate, wherein the side recess extends from the first surface toward the second surface;
an upper recess on at least a first side of the dielectric layer outside the conducting pad; and
a conducting layer electrically connected to the conducting pad and extending to the upper recess and the side recess, wherein the conducting layer extends across the seal ring to the upper recess and the side recess.

24. The chip package as claimed in claim 23, wherein each of distances between each side of the seal ring and a corresponding side of the semiconductor substrate is the same.

25. The chip package as claimed in claim 23, wherein a distance between the first side and one side of the seal ring adjacent thereto is greater than each of distances between other three sides of the seal ring and other three corresponding sides of the semiconductor substrate.

26. A chip package, comprising:
a semiconductor substrate having a first surface and a second surface opposite thereto;
a dielectric layer overlying the first surface of the semiconductor substrate, wherein the dielectric layer comprises an opening exposing a conducting pad;
a side recess on at least a first side of the semiconductor substrate, wherein the side recess extends from the first surface toward the second surface;
an upper recess on at least a first side of the dielectric layer outside the conducting pad;
a conducting layer electrically connected to the conducting pad and extending to the upper recess and the side recess; and
an insulating layer disposed under the conducting layer and on the dielectric layer and the semiconductor substrate, wherein the conducting layer extends onto a protrusion of the insulating layer or into a trench of the insulating layer, and the conducting layer comprises a first portion adjacent to the protrusion or the trench and a second portion connected to the first portion, and wherein the first portion has a width greater than that of the second portion.

* * * * *